US009429612B2

(12) United States Patent
Choi et al.

(10) Patent No.: US 9,429,612 B2
(45) Date of Patent: Aug. 30, 2016

(54) METHODS AND APPARATUSES FOR GENERATING REAL-ENVIRONMENT NOISE USING STATISTICAL APPROACH

(71) Applicant: Electronics and Telecommunications Research Institute, Daejeon (KR)

(72) Inventors: Su Na Choi, Daejeon (KR); Jong Hwa Kwon, Daejeon (KR)

(73) Assignee: ELECTRONICS AND TELECOMMUNICATIONS RESEARCH INSTIT, Daejeon-Si (KR)

( * ) Notice: Subject to any disclaimer, the term of this patent is extended or adjusted under 35 U.S.C. 154(b) by 120 days.

(21) Appl. No.: 14/601,397

(22) Filed: Jan. 21, 2015

(65) Prior Publication Data

US 2015/0223001 A1 Aug. 6, 2015

(30) Foreign Application Priority Data

Feb. 4, 2014 (KR) ........................ 10-2014-0012442

(51) Int. Cl.
*G01R 31/00* (2006.01)
(52) U.S. Cl.
CPC .................................... *G01R 31/002* (2013.01)
(58) Field of Classification Search
CPC .................................................. G01R 31/002
See application file for complete search history.

(56) References Cited

U.S. PATENT DOCUMENTS

| 6,163,608 A | 12/2000 | Romesburg et al. |
| 7,650,271 B2* | 1/2010 | O'Mahony et al. ................... G06F 17/5036 703/14 |
| 9,331,681 B2* | 5/2016 | Midha et al. ............ H03K 3/84 |
| 2005/0137814 A1* | 6/2005 | Kelly et al. ............ G01R 29/26 702/69 |
| 2009/0094492 A1* | 4/2009 | Music et al. .......... G06F 11/261 714/715 |
| 2011/0228946 A1 | 9/2011 | Chen et al. |
| 2014/0142883 A1* | 5/2014 | Bartley et al. ......... G01R 27/28 702/111 |

FOREIGN PATENT DOCUMENTS

| KR | 1020050005054 A | 1/2005 |
| KR | 1020060071290 A | 6/2006 |

\* cited by examiner

*Primary Examiner* — Paul Huber
(74) *Attorney, Agent, or Firm* — William Park & Associates Ltd.

(57) ABSTRACT

Disclosed are method and apparatus of generating noise that effectively performs performance evaluation of electronic equipment in a real environment by generating the noise having a statistic characteristic of real noise in a laboratory environment, by estimating a noise parameter set by measuring the noise and generating random noise data using a random noise data generation function having a statistic characteristic corresponding to the noise parameter set to generate radio noise.

20 Claims, 12 Drawing Sheets

METHODS AND APPARATUSES FOR GENERATING REAL-ENVIRONMENT NOISE USING STATISTICAL APPROACH

Priority to Korean patent application number 10-2014-0012442 filed on Feb. 4, 2014, the entire disclosure of which is incorporated by reference herein, is claimed.

BACKGROUND OF THE INVENTION

1. Field of the Invention

The present invention relates to a method of evaluating performance of an electronic device, and more particularly, to a method of generating noise for evaluating performance of the electronic device.

2. Discussion of the Related Art

The performance of an electronic device is evaluated by assuming an ideal Gaussian noise environment. However, actually, the electronic devices are used under an environment in which various propagation noises exist. The noise of the actual environment includes an impulse component, and the like and the performance of the electronic device deteriorates due to the noise or a probability that interference with other electronic communication and apparatuses will be caused is increased. For this reason, it is important to analyze performance for noise under an environment in which electronic devices are actually applied, but it is difficult to reproduce the noise under a laboratory environment. Further, real environment noise is a value which may be changed with time and it is important to reproduce a statistical characteristic rather than similarly replicating a value of absolute noise at a specific timing. Accordingly, for substantial performance evaluation of the electronic device, noise reproduction technology using a statistical technique is required to implement a characteristic of real-environment noise even at a laboratory level.

SUMMARY OF THE INVENTION

An object of the present invention is to provide method and apparatus of generating a real-environment noise by using a statistical approach.

In accordance with an embodiment of the present invention, a method of generating a noise parameter which is performed by an apparatus of generating the noise parameter, includes: generating noise data by measuring the noise; selecting a noise model for processing the noise data; and estimating a parameter of the noise data by using the noise data and the noise model.

The generating of the noise data may include estimating the noise in a frequency domain in a predetermined frequency range.

The generating of the noise data may include measuring the noise, selecting a frequency band having a level of the noise of a predetermined reference value or more as a noise frequency band, and generating the noise data by measuring the noise in the noise frequency band.

The generating the noise data by measuring the noise in the noise frequency band may include generating the noise data by repetitively measuring the noise at a predetermined time interval.

The generating the noise data by measuring the noise in the noise frequency band may include generating amplitude probability distribution (APD) data by performing APD mode measurement.

The selecting of the noise model for processing the noise data may include selecting a noise model for generating the noise parameter according to a format of the noise data.

In accordance with another embodiment of the present invention, a method of generating noise data which is performed by an apparatus of generating the noise data, includes: receiving an estimated parameter; selecting a noise data generating method according to the parameter; and generating noise data by using the parameter and the noise data generating method.

The selecting of the method of generating the noise data according to the parameter may include selecting the method of generating the noise data using a random noise data generation function having a predetermined statistic characteristic corresponding to the parameter.

The selecting of the method of generating the noise data according to the parameter may include selecting a noise model according to the parameter; and selecting the method of generating the noise data using the random noise data generation function having the predetermined statistic characteristic corresponding to the noise model.

The generating of the noise data by using the parameter and the method of generating the noise data may include generating random noise data by using the parameter and the method of generating the noise data; and generating complex noise data by using the random noise data.

In accordance with yet another embodiment of the present invention, a method of generating noise which is performed by an apparatus of generating the noise, includes: estimating a noise parameter set by measuring noise; generating noise data by using the noise parameter set and a random noise data generating function having a statistical characteristic corresponding to the noise parameter set; and generating radio noise.

The generating the radio noise by using the noise data may include setting equipment to a condition of equipment that measures the noise parameter set.

In accordance with still another embodiment of the present invention, an apparatus of estimating a noise parameter, includes: a receiving unit configured to receive a radio signal; and a noise parameter estimating unit configured to generate the noise data by measuring the noise from the received radio signal, select a noise model for processing the noise data, and estimate the parameter of the noise data by using the noise data and the noise model.

The noise parameter estimating unit may select a frequency band in which a level of the noise of a predetermined reference value or more is measured in a frequency domain in a predetermined frequency range, as a noise frequency band, and measure the noise in the noise frequency band to generate the noise data.

The noise parameter estimating unit may generate the noise data by repetitively measuring the noise in the noise frequency band according to a predetermined time interval.

The noise parameter estimating unit may generate APD data by performing APD mode measurement in the noise frequency band.

The noise parameter estimating unit may select a noise model for generating a noise parameter according to a format of the noise data.

In accordance with still yet another embodiment of the present invention, an apparatus of generating noise data includes: an input unit configured to receive a noise parameter set; and a noise data generating unit configured to generate the noise data by using the noise parameter and a random noise data generation function having a statistic characteristic corresponding to the noise parameter.

The noise data generating unit may select a noise model according to a parameter property of the noise parameter and select a random noise data generation function having the statistic characteristic according to the noise model.

The noise data generating unit may generate complex noise data by using the noise data.

In accordance with still yet another embodiment of the present invention, a method of generating noise, includes: an input unit configured to receive a noise parameter and noise data generated by a noise data generating method; and a noise generating unit configured to set equipment to a condition of equipment that measures the noise parameter and generate radio noise by using the noise data.

According to the embodiments of the present invention, it is possible to provide noise which may be effectively applied to performance evaluation of electronic equipment in a real environment by generating the noise having a statistic characteristic of real noise in a laboratory environment, by measuring the noise to estimate a noise parameter set and generating random noise data using a random noise data generation function having a statistic characteristic corresponding to the noise parameter set to generate radio noise.

DETAILED DESCRIPTION OF THE EMBODIMENTS

Figure 1:
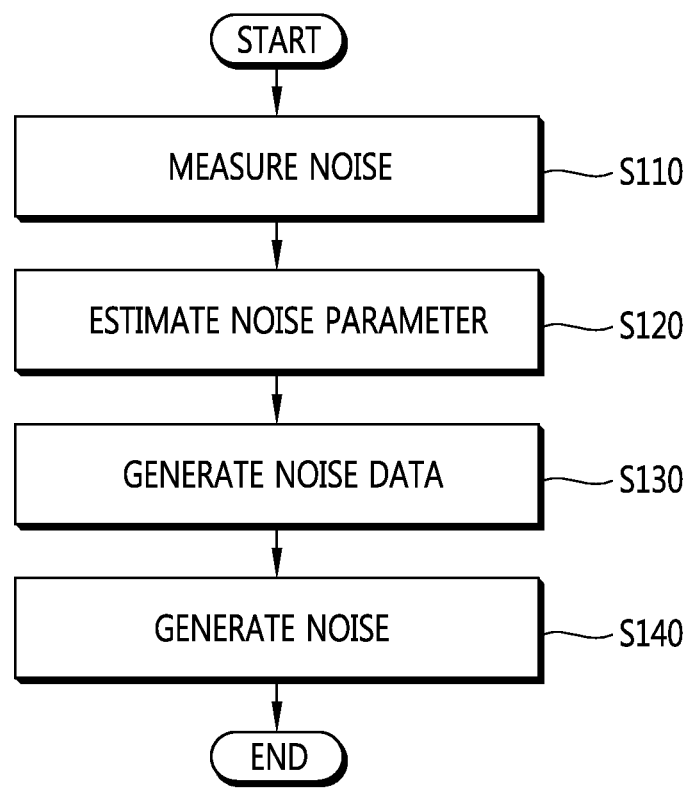
FIG. 1 is a flowchart describing a method of generating noise performed in an apparatus of generating noise according to an embodiment of the present invention.

The present invention may have various modifications and various exemplary embodiments and specific exemplary embodiments will be illustrated in the drawings and described in detail.

However, this does not limit the present invention within specific exemplary embodiments, and it should be understood that the present invention covers all the modifications, equivalents and replacements within the idea and technical scope of the present invention.

Terms such as first or second may be used to describe various components but the components are not limited by the above terminologies. The above terminologies are used only to discriminate one component from the other component. For example, without departing from the scope of the present invention, a first component may be referred to as a second component, and similarly, a second component may be referred to as a first component. A terminology such as and/or includes a combination of a plurality of associated items or any item of the plurality of associated items.

It should be understood that, when it is described that an element is "coupled" or "connected" to another element, the element may be "directly coupled" or "directly connected" to the another element or "coupled" or "connected" to the another element through a third element. In contrast, it should be understood that, when it is described that an element is "directly coupled" or "directly connected" to another element, it is understood that no element is not present between the element and the another element.

Terms used in the present application are used only to describe specific exemplary embodiments, and are not intended to limit the present invention. A singular form may include a plural form if there is no clearly opposite meaning in the context. In the present application, it should be understood that term "include" indicates that a feature, a number, a step, an operation, a component, a part or the combination thereof described in the specification is present, but does not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. It should be understood that terms defined in a generally used dictionary have the same meanings as contextual meanings of associated techniques and if not apparently defined in this application, the terms are not ideally or excessively understood as formal meanings.

Hereinafter, a preferable embodiment of the present invention will be described in more detail with reference to the accompanying drawings. In describing the present invention, like reference numerals refer to like elements for easy overall understanding and a duplicated description of like elements will be omitted.

Real-environment noise is a value which may be changed with time, and it is important to reproduce a statistic characteristic as compared with a value of absolute noise at a specific time. To this end, the present invention provides a method of generating real-environment noise by applying a statistic approach and an apparatus thereof, which may be applied to evaluation in performance of the electronic device.

FIG. 1 is a flowchart describing a method of generating noise performed in an apparatus of generating noise according to an embodiment of the present invention. The method of generating the noise according to the embodiment of the present invention may generate noise having a similar characteristic to real-environment noise by using a statistic approach. The method of generating the noise by an apparatus of generating noise according to an embodiment of the present invention will be described with reference to FIG. 1. First, the apparatus of generating the noise measures the noise (S110). Next, the apparatus of generating the noise generates a noise parameter based on the measured noise (S120). Next, the apparatus of generating the noise generates noise data by using the noise parameter (S130). Finally, the apparatus of generating the noise generates the noise by using the noise data.

The measuring of the noise (S110) will be described in more detail. The apparatus of generating the noise may measure the real-environment noise by using a receiving unit including at least one of an antenna, an EMI probe, and a receiver. The apparatus of generating the noise may measure the real-environment noise in a complex data format including at least one of an I/Q, a level, and a phase of the noise according to a frequency. The apparatus of generating the noise may measure a statistic characteristic of impulse noise by using the data.

Figure 2:
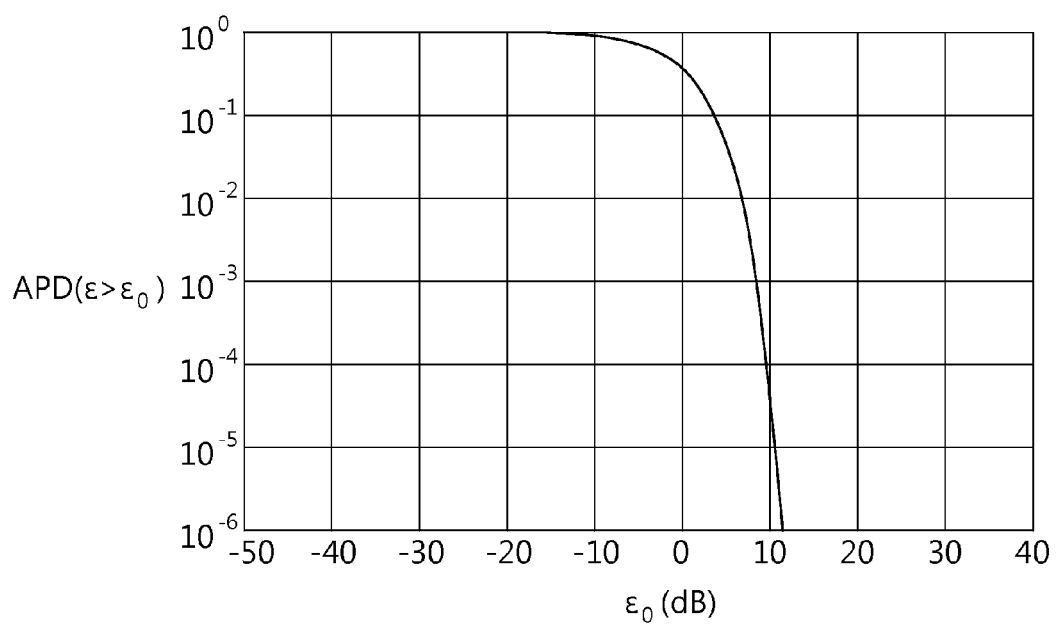
FIG. 2 illustrates an APD graph according to an embodiment of Gaussian noise.

Further, the apparatus of generating the noise may directly measure an amplitude probability distribution (APD) of the noise at a specific frequency, by providing an APD measuring mode provided in the EMI receiver and the like. The APD is a statistic value which is defined by probability of a time when a level of the noise $\epsilon$ exceeds a specific value $\epsilon_0$. In the ADP graph, a vertical axis represents a probability that the measured level of the noise exceeds a value of a horizontal value. FIG. 2 illustrates an APD graph according to an embodiment of Gaussian noise.

Figure 3:
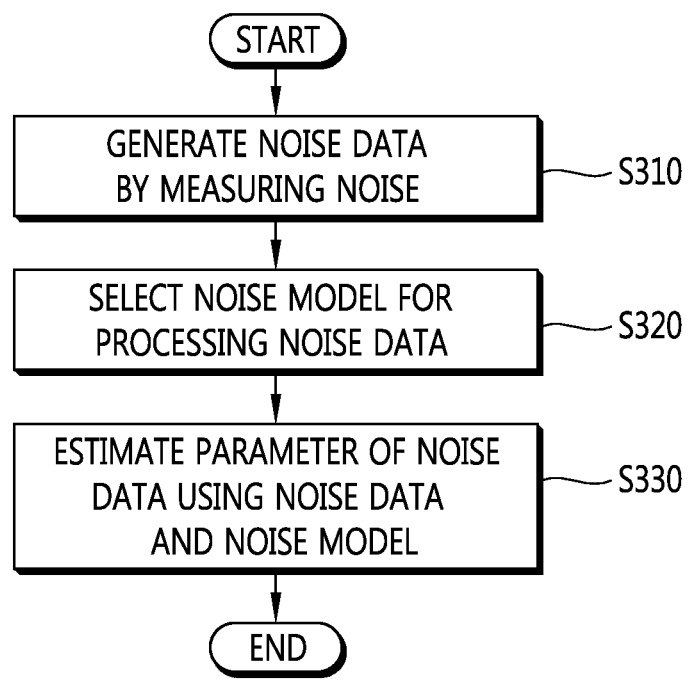
FIG. 3 is a flowchart describing a method of generating a noise parameter by an apparatus of generating noise according to an embodiment of the present invention.

FIG. 3 is a flowchart describing a method of generating a noise parameter by an apparatus of generating noise according to an embodiment of the present invention. A method of estimating the noise parameter which may be used in the estimating of the noise parameter (S120) described with reference to FIG. 1 will be described. Hereinafter, the apparatus of generating the noise will be described, but the method of estimating the noise parameter may be performed by the apparatus of estimating the noise parameter which aims to generate the noise parameter.

First, the apparatus of generating the noise generates noise data by measuring the noise (S310). The apparatus of generating the noise may measure the noise in a frequency domain in a predetermined frequency range. For example, the apparatus of generating the noise measures the noise the frequency domain in the predetermined frequency range to secure real noise data at a cut-off frequency.

Figure 4:
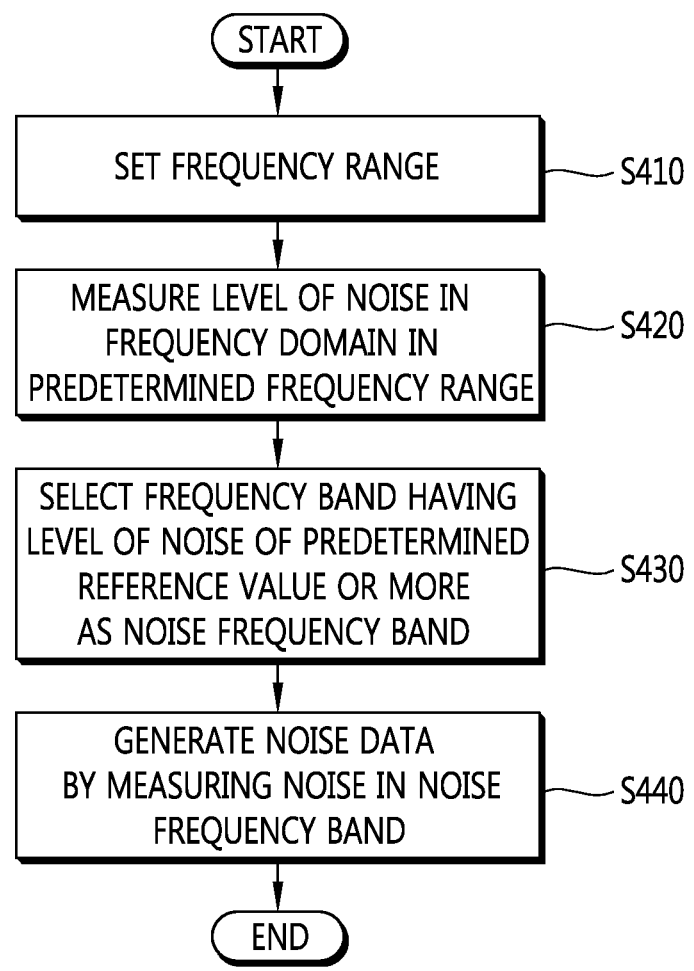
FIG. 4 is a flowchart describing a method of generating noise data in a real environment.

FIG. 4 is a flowchart describing a method of generating noise data in a real environment. A method of generating noise data in a real environment will be described with reference to FIG. 4. The apparatus of generating the noise first sets a range of a frequency to be measured (S410). Next, the apparatus of generating the noise measures the level of the noise in the frequency domain in the set frequency range (S420). The apparatus of generating the noise sets a frequency band having a level of the noise of a predetermined reference value or more as a noise frequency band, as a result obtained by measuring the level of the noise (S430). Here, the predetermined reference is the predetermined reference value in the apparatus of generating the noise or a value inputted by an operator of the apparatus of generating the noise.

Next, the apparatus of generating the noise generates the noise data by measuring the noise in the noise frequency band (S440). The apparatus of generating the noise may obtain a large amount of data for statistically analyzing the noise data by repetitively measuring the noise with time in the noise frequency band. For example, the apparatus of generating the noise may generate the noise data in quantity by repetitively measuring the noise at a predetermined time interval. Further, the apparatus of generating the noise may also generate APD data such as the probability that the level of the noise exceeds the predetermined reference value by performing the APD mode noise measurement in the noise frequency band.

Referring back to FIG. 3, the method of estimating the noise parameter will be described. Next, the apparatus of generating the noise selects a noise model for processing the noise data (S320). The apparatus of generating the noise may select a noise model for generating the noise parameter according to a format of the noise data.

In multiple noise models suitable to be applied to the real-environment noise, for example, noise models such as Class A and Class B noise models proposed by Middleton may be included. For example, the Middleton Class A and Class B noise models may be classified by a relationship between a bandwidth of the noise and a bandwidth of the receiver. The Middleton Class A and Class B noise models are defined as the Class A noise in the case where the bandwidth of the noise is smaller than the bandwidth of the receiver, and defined as the Class B noise in the case where the bandwidth of the noise is larger than the bandwidth of the receiver. With the development in technology, as the receivers having a large bandwidth of several MHz or more is increased, most of radio noise may be modeled to the Class A noise model, and environment noise having an above-average broad bandwidth and the like may be modeled to the Class B noise model.

Figure 5:
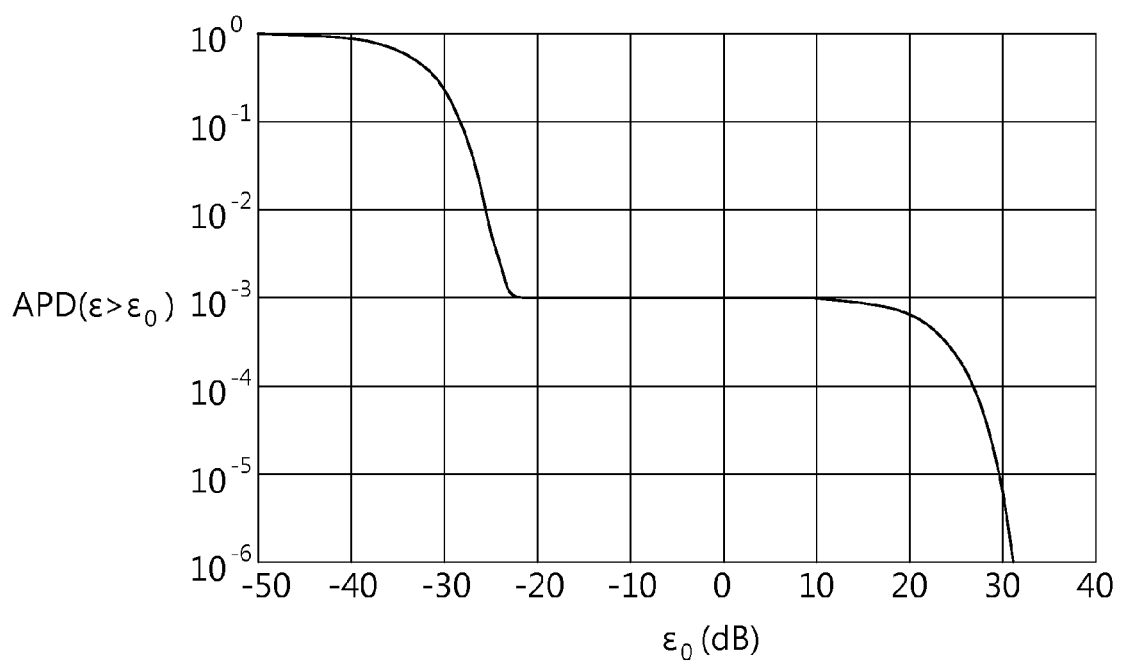
FIG. 5 is a diagram illustrating an APD graph of Class A noise.
Figure 6:
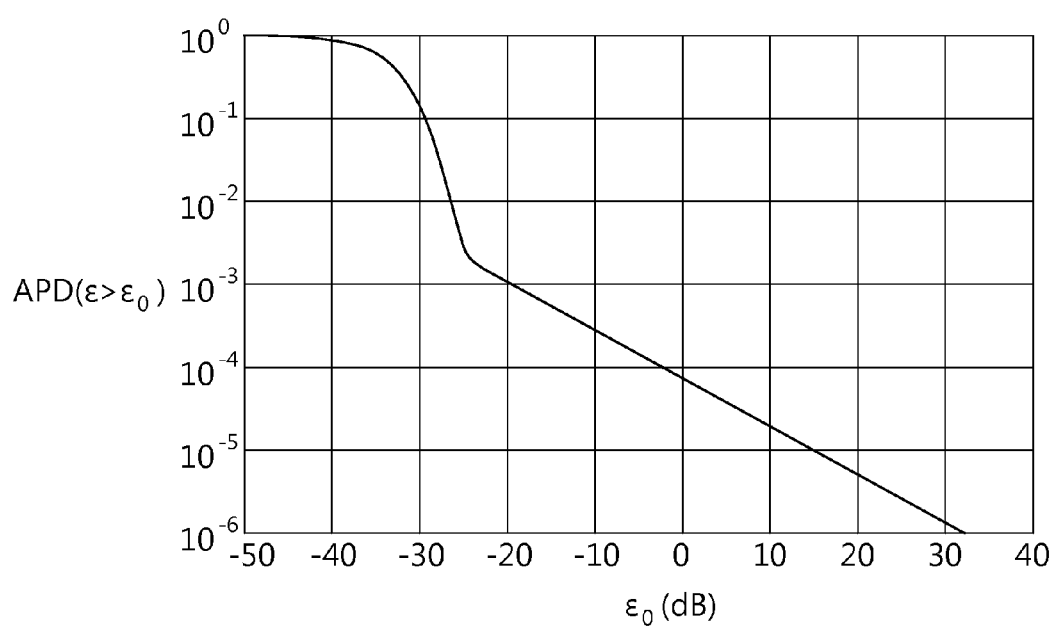
FIG. 6 is a diagram illustrating an APD graph of Class B noise.

The apparatus of generating the noise may infer noise which is expected in the measurement environment to select the noise model, or receive an input of a user to select the noise model. Further, the apparatus of generating the noise may analyze an APD format of the measured noise to select the noise model. FIG. 5 is a diagram illustrating an APD graph of Class A noise, and FIG. 6 is a diagram illustrating an APD graph of Class B noise. Referring to FIGS. 5 and 6, for example, in the case of the Class A noise, an APD graph is curved at a middle point as illustrated in FIG. 5 and has a flat shape, and in the case of the Class B noise, as illustrated in FIG. 6, the graph is curved at the middle point and has a predetermined slope.

For example, the apparatus of generating the noise may select the Class A noise model as a model for generating the noise parameter by using this respect, when the APD graph of the measured noise is curved at the middle point as illustrated in FIG. 5 and has a flat period. In the same way, the apparatus of generating the noise may select the Class B noise model as the model for generating the noise parameter, when the APD graph of the measured noise is curved at the middle point as illustrated in FIG. 6 and has a period having a predetermined slope.

Next, the apparatus of generating the noise estimates a parameter of the noise data by using the noise data and the noise model (S330). The apparatus of generating the noise extracts a noise parameter which characterizes the selected noise model by using the measured noise data. For example, in the Class A noise model, since statistic characteristics are determined to two noise parameters $A_A$ and $\Gamma_A$, in the case where the Class A noise model is selected as the noise model, the apparatus of generating the noise may extract the two noise parameters $A_A$ and $\Gamma_A$ from the noise data to determine the statistic characteristic of the noise data. Similarly, in the Class B noise model, since statistic characteristics are determined to five noise parameters $A_B$, $\Gamma_B$, $\alpha$, $A_\alpha$, and $N_I$, in the case where the Class B noise model is selected as the noise model, the apparatus of generating the noise may extract the five noise parameters $A_B$, $\Gamma_B$, $\alpha$, $A_\alpha$, and $N_I$ from the noise data to determine the statistic characteristic of the noise data.

The noise parameter obtained above may be estimated by various methods. For example, in the case of the Class A noise, the parameter may be estimated by applying a moment method, an APD method, an expectation and maximization (EM) method, and the like, and in the case of the Class B noise, the parameter may be estimated by applying the APD method, a least square gradient method (LSGM) of a specific function, and the like. The moment method is a method of estimating a parameter of the Class A noise, by using that an average of second, fourth, and sixth squares of the measured noise level, that is, a value of the second, fourth, and sixth moments may be expressed as a relation for the parameters. For example, in the moment method, the moment means the average of the square values of the levels, and the moment method expresses values of m2 (the second moment) which is an average value of 2 squares of the measured noise level, m4 (the fourth moment) which is an average value of 4 squares of the measured noise level, and m6 (the sixth moment) which is an average value of 6 squares, as a relation for the noise parameters. Accordingly, the moments are obtained by measuring the level of the noise to estimate the parameter. The APD method is a method of empirically estimating the parameter value in a curved form of the APD graph which measures the noise. The EM method is an estimating method of minimizing a match probability of the parameters by repetitively performing the estimation and the calculation using a probability function. The LSGM method is a method of estimating the parameter that minimizes an error through the repetitive calculation using the specific function.

Figure 7:
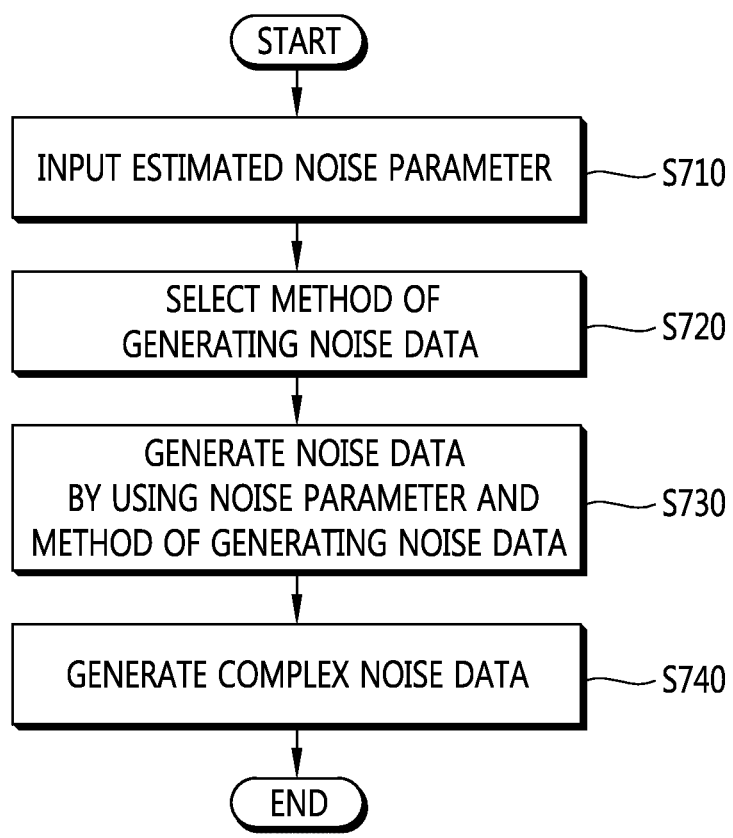
FIG. 7 is a flowchart describing a method of generating noise data by an apparatus of generating noise according to an embodiment of the present invention.

FIG. 7 is a flowchart describing a method of generating noise data by an apparatus of generating noise according to an embodiment of the present invention. Hereinafter, the apparatus of generating the noise is described, but the method of generating the noise data may be performed by the apparatus of generating the noise data which aims to generate the noise data.

The apparatus of generating the noise according to the embodiment of the present invention may generate noise having the same statistic characteristic as the noise measured in a real environment by using the estimated parameter. The apparatus of generating the noise receives the estimated parameter as the noise parameter (S710). The apparatus of generating the noise receives the noise parameter estimated from a noise parameter estimating apparatus to use the received noise parameter as the noise parameter or use a self-estimated noise parameter as the noise parameter.

Next, the apparatus of generating the noise selects the method of generating the noise data according to the noise parameter (S720). The apparatus of generating the noise deduces a statistic function by using the noise parameter. For example, random data having a statistic characteristic deduced by using a tool such as Matlab may be generated. The apparatus of generating the noise may store noise parameters having various characteristics or noise parameter sets having various characteristics, and matching data of a noise data generation function corresponding thereto. The apparatus of generating the noise may select a noise data generation function which may be used for the noise parameter, by using the noise parameters or the noise parameter sets and the matching data of the noise data generation function corresponding thereto, which are pre-stored. Here, the noise data generation function may be a random noise data generation function having a statistic characteristic.

For example, the apparatus of generating the noise may select the noise model according to the noise parameters or the noise parameter sets, and select the random noise data generation function which is pre-defined as a usable noise data generation function corresponding to the selected noise model by the method of generating the noise data. The random noise data generation function may be a function having a statistic characteristic.

Next, the apparatus of generating the noise generates noise data by using the method of generating the noise parameter and the noise data (S730). The apparatus of generating the noise generates random noise data by using the method of generating the noise parameter and the noise data. For example, the apparatus of generating the noise may generate the random noise data with a complex data format. By the method, in the measuring of the noise, not data which copies a value of the measured real-environment noise data as it is but random noise data having a statistically similar characteristic to the value of the real-environment noise data measured in the measuring of the noise.

Next, the apparatus of generating the noise generates the complex noise data by using the random noise data (S740). The apparatus of generating the noise may output the generated complex noise data. The generating of the complex noise data may finish the method of generating the noise data by generating the random noise data if necessary, and transmit the random noise data by output.

Figure 8:
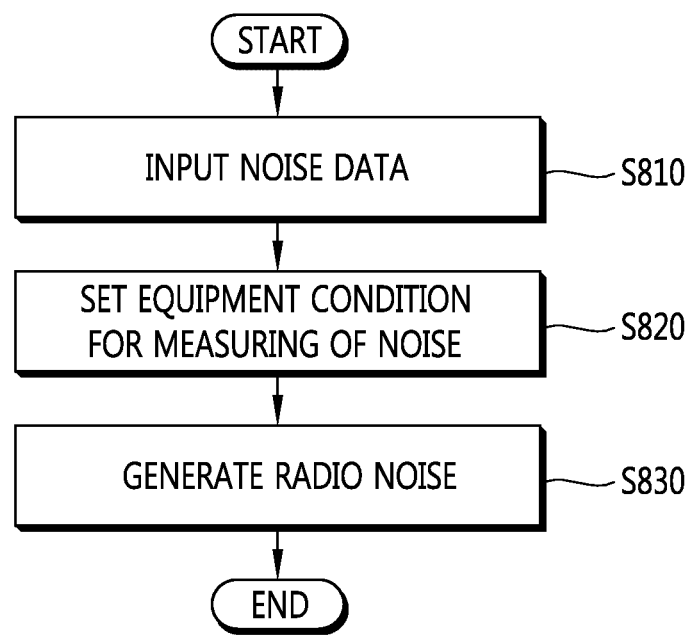
FIG. 8 is a flowchart describing a method of generating radio noise by using noise data.

FIG. 8 is a flowchart describing a method of generating radio noise by using noise data. Referring to FIG. 8, the generating of the radio noise (S140) will be described by using the noise data. The apparatus of generating the noise according to the embodiment of the present invention first receives the noise data (S810). The noise data received to the apparatus of generating the noise is random noise data or complex noise data generated by using the random noise data. Meanwhile, in the case where the apparatus of generating the noise generates the noise data by using the method of generating the noise data described above, the receiving of the noise data (S810) may be omitted. Next, the apparatus of generating the noise sets an equipment condition as a condition of equipment which measures the noise parameter set (S820). The setting of the equipment condition may be omitted if necessary. Finally, the apparatus of generating the noise generates the generated noise data by radio (S830). The apparatus of generating the noise may generate the noise by including equipment such as a signal generator. For example, the apparatus of generating the noise may generate the noise by radio through an antenna, by setting the same as the condition during the measuring of the real environment. Accordingly, an environment having statistically similar noise to the real environment in which the electron equipment is installed may be reproduced at a laboratory level.

FIG. 8 is a block diagram of an apparatus of estimating noise parameter according to an embodiment of the present invention. An apparatus of estimating the noise parameter according to an embodiment of the present invention performs the method of estimating the noise parameter according to the embodiment of the present invention, and includes a receiving unit 910 and a noise parameter estimating unit 920. The receiving unit 910 receives a radio signal. The noise parameter estimating unit 920 generates the noise data by measuring the noise from the received radio signal, selects a noise model for processing the noise data, and estimates the parameter of the noise data by using the noise data and the noise model.

The noise parameter estimating unit 920 may select the frequency band in which a level of the noise of a predetermined reference value or more is measured in a frequency domain in a predetermined frequency range, as a noise frequency band, and measures the noise in the noise frequency band to generate the noise data.

The noise parameter estimating unit 920 may generate the noise data by repetitively measuring the noise in the noise frequency band at a predetermined time interval, or generate APD data by performing the APD mode measurement in the noise frequency band.

Further, the noise parameter estimating unit 920 may select the noise model for generating the noise parameter according to a format of the noise data.

Figure 10:
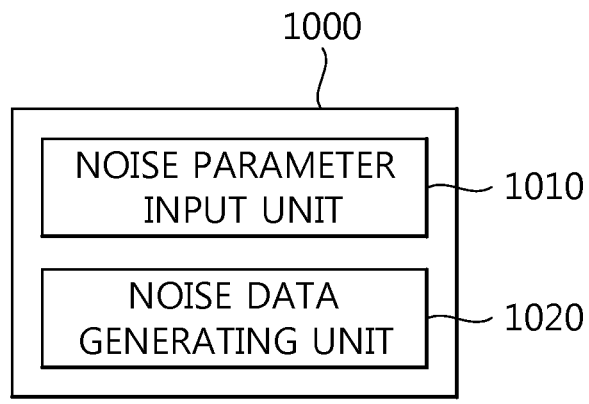
FIG. 10 is a block diagram of an apparatus of generating noise data according to an embodiment of the present invention.

FIG. 10 is a block diagram of an apparatus of generating noise data according to an embodiment of the present invention. An apparatus of generating the noise data according to an embodiment of the present invention performs the method of generating the noise data according to the embodiment of the present invention, and includes a noise parameter input unit 1010 and a noise data generating unit 1020. The noise parameter input unit 1010 receives a noise parameter or a noise parameter set. The noise data generating unit 1020 generates the noise data by using the noise parameter set and a random noise data generation function having a statistic characteristic corresponding to the noise parameter set. The noise data generating unit 1020 may select the noise mode according to a parameter property of the noise parameter set, and select the random noise data generation function having the statistic characteristic according to the noise model. The noise data generating unit 1020 may generate complex noise data by using noise data.

Figure 11:
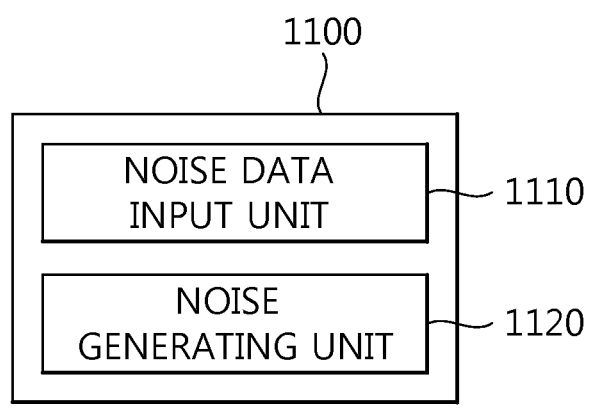
FIG. 11 is a block diagram of an apparatus of generating noise according to an embodiment of the present invention.

FIG. 11 is a block diagram of an apparatus of generating noise data according to an embodiment of the present invention. An apparatus of generating noise according to the embodiment of the present invention performs the method of generating the noise according to the embodiment of the present invention, and includes a noise data input unit 1110 and a noise generating unit 1120. The noise data input unit 1110 receives the noise data generated by using the method of generating the noise data to the noise parameter. The noise generating unit 1120 sets equipment to a condition of equipment which measures the noise parameter, and generates radio noise by using the noise data.

Figure 9:
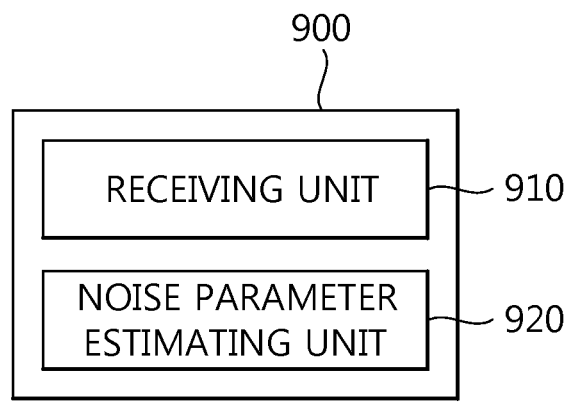
FIG. 9 is a block diagram of an apparatus of estimating noise parameter according to an embodiment of the present invention.
Figure 12:
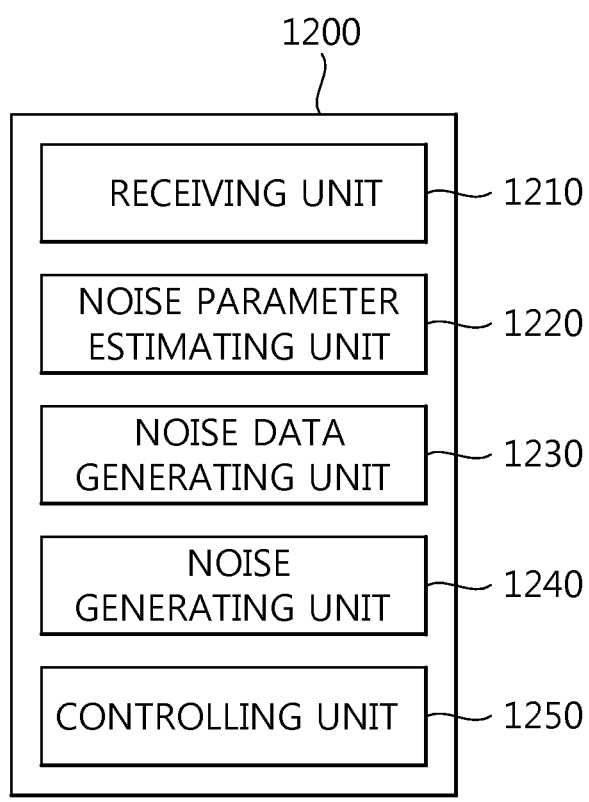
FIG. 12 is a diagram illustrating an apparatus of generating noise according to another embodiment of the present invention.

FIG. 12 is a diagram illustrating an apparatus of generating noise according to another embodiment of the present invention. At least one of the aforementioned apparatus of estimating the noise parameter, the apparatus of generating the noise parameter, and the apparatus of generating the noise may be configured by one apparatus of generating the noise. The apparatus of generating the noise according to another embodiment of the present invention illustrated in FIG. 12 includes a receiving unit 1210, a noise parameter estimating unit 1220, a noise data generating unit 1230, and a noise generating unit 1240, which are described above. Each configuration may be independently controlled, but the apparatus of generating the noise may further include a controlling unit 1250 which controls operations of the receiving unit 1210, the noise parameter estimating unit 1220, the noise data generating unit 1230, and the noise generating unit 1240. Each configuration performs the same function as each configuration described in FIGS. 9 to 11, but the configurations may be configured by one apparatus.

The receiving unit 1210 receives a radio signal and transfers the received radio signal to the noise parameter estimating unit 1220. The noise parameter estimating unit 1220 generates the noise data by measuring the noise from the received radio signal, selects a noise model for processing the noise data, and estimates the parameter of the noise data by using the noise data and the noise model. The noise parameter estimating unit 1220 may select the frequency band in which a level of the noise of a predetermined reference value or more is measured in a frequency domain in a predetermined frequency range, as a noise frequency band, and measures the noise in the noise frequency band to generate the noise data. Further, the noise parameter estimating unit 1220 may generate the noise data by repetitively measuring the noise in the noise frequency band at a predetermined time interval, or generate APD data by performing the APD mode measurement in the noise frequency band. The noise parameter estimating unit 1220 may select the noise model for generating the noise parameter according to a format of the noise data. The noise parameter estimating unit 1220 transfers the estimated noise parameter or a noise parameter set which is a set of the estimated noise parameters to the noise data generating unit 1230.

The noise data generating unit 1230 generates the noise data by using the noise parameter or the noise parameter set and a random noise data generation function having a statistic characteristic corresponding to the noise parameter set. The noise data generating unit 1230 may select a noise mode according to a parameter property of the noise parameter of the noise parameter set, and select the random noise data generation function having the statistic characteristic according to the noise model. The noise data generating unit 1230 may generate complex noise data by using the noise data. The noise data generating unit 1230 transfers the generated noise data to the noise generating unit 1240.

The noise generating unit 1240 sets equipment to a condition of equipment which measures the noise parameter, and generates radio noise by using the noise data.

Although the present invention described as above has been described based on a series of functional blocks, the present invention is not limited to the aforementioned embodiments and the accompanying drawings and it will be apparent to those skilled in the art that various substitutions, modifications, and changes can be made within the scope without departing from the technical spirit of the present invention.

Combinations of the aforementioned embodiments are not limited to the aforementioned embodiments and the aforementioned embodiments and various types of combinations may be provided according to implementation and/or as necessary.

In the aforementioned embodiments, methods have been described based on flowcharts as a series of steps or blocks, but the methods are not limited to the order of the steps of the present invention and any step may occur in a step or an order different from or simultaneously as the aforementioned step or order. Further, it can be appreciated by those skilled in the art that steps shown in the flowcharts are not exclusive and other steps may be included or one or more steps do not influence the scope of the present invention and may be deleted.

The embodiments include examples of various aspects. All available combinations for showing various aspects may not be described, but those skilled in the art will be able to recognize that other combinations are available. Accordingly, the present invention will hereinafter include all other replacements, modifications, and changes that belong to the appended claims.

What is claimed is:

1. A method of generating noise which is performed by an apparatus of generating the noise, the method comprising:
generating noise data by measuring the noise;
selecting a noise model for processing the noise data; and
estimating a parameter of the noise data by using the noise data and the noise model.

2. The method of claim 1, wherein the generating of the noise data includes
estimating the noise in a frequency domain in a predetermined frequency range.

3. The method of claim 1, wherein the generating of the noise data includes:
measuring the noise;
selecting a frequency band having a level of the noise of a predetermined reference value or more as a noise frequency band; and
generating the noise data by measuring the noise in the noise frequency band.

4. The method of claim 3, wherein the generating the noise data by measuring the noise in the noise frequency band includes
generating the noise data by repetitively measuring the noise at a predetermined time interval.

5. The method of claim 3, wherein the generating the noise data by measuring the noise in the noise frequency band includes
generating amplitude probability distribution (APD) data by performing APD mode measurement.

6. The method of claim 1, wherein the selecting of the noise model for processing the noise data includes
selecting a noise model for generating the noise parameter according to a format of the noise data.

7. The method of claim 1, further comprising:
after the estimating of the parameter of the noise data by using the noise data and the noise model,
selecting a method of generating the noise data according to the parameter; and
generating the noise data by using the parameter and the method of generating the noise data.

8. The method of claim 7, wherein the selecting of the method of generating the noise data according to the parameter includes
selecting the method of generating the noise data using a random noise data generation function having a predetermined statistic characteristic corresponding to the parameter.

9. The method of claim 7, wherein the selecting of the method of generating the noise data according to the parameter includes:
selecting a noise model according to the parameter; and
selecting the method of generating the noise data using the random noise data generation function having the predetermined statistic characteristic corresponding to the noise model.

10. The method of claim 7, wherein the generating of the noise data by using the parameter and the method of generating the noise data includes:
generating random noise data by using the parameter and the method of generating the noise data; and
generating complex noise data by using the random noise data.

11. The method of claim 7, further comprising:
after the generating of the noise data by using the parameter and the method of generating the noise data,
setting equipment to a condition of equipment that measures the parameter; and
generating radio noise by using the noise data.

12. An apparatus of generating noise, comprising:
a receiving unit configured to receive a radio signal; and
a noise parameter estimating unit configured to generate noise data by measuring the noise from the received radio signal, select a noise model for processing the noise data, and estimate the parameter of the noise data by using the noise data and the noise model.

13. The apparatus of claim 12, wherein the noise parameter estimating unit selects a frequency band in which a level of the noise of a predetermined reference value or more is measured in a frequency domain in a predetermined frequency range, as a noise frequency band, and measures the noise in the noise frequency band to generate the noise data.

14. The apparatus of claim 13, wherein the noise parameter estimating unit generates the noise data by repetitively measuring the noise in the noise frequency band according to a predetermined time interval.

15. The apparatus of claim 13, wherein the noise parameter estimating unit generates amplitude probability distribution (APD) data by performing APD mode measurement in the noise frequency band.

16. The apparatus of claim 15, wherein the noise parameter estimating unit selects a noise model for generating a noise parameter according to a format of the noise data.

17. The apparatus of claim 12, further comprising a noise data generating unit configured to generate the noise data by using the noise parameter and a random noise data generation function having a statistic characteristic corresponding to the noise parameter.

18. The apparatus of claim 17, wherein the noise data generating unit selects a noise model according to a parameter property of the noise parameter and selects a random noise data generation function having the statistic characteristic according to the noise model.

19. The apparatus of claim 18, wherein the noise data generating unit generates complex noise data by using the noise data.

20. The apparatus of claim 12, further comprising a noise generating unit configured to set equipment to a condition of equipment that measures the noise parameter and generate radio noise by using the noise data.

* * * * *